(12) United States Patent
Lushington

(10) Patent No.: US 9,247,640 B2
(45) Date of Patent: Jan. 26, 2016

(54) SILVER HALIDE CONDUCTIVE ELEMENT PRECURSOR AND DEVICES

(71) Applicant: Kenneth James Lushington, Rochester, NY (US)

(72) Inventor: Kenneth James Lushington, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 109 days.

(21) Appl. No.: 14/166,910

(22) Filed: Jan. 29, 2014

(65) Prior Publication Data

US 2015/0216043 A1 Jul. 30, 2015

(51) Int. Cl.
| | | |
|---|---|---|
| *G03C 1/76* | (2006.01) | |
| *H05K 1/02* | (2006.01) | |
| *G03C 5/29* | (2006.01) | |
| *G03C 1/005* | (2006.01) | |
| *G03F 7/06* | (2006.01) | |
| *G03F 7/095* | (2006.01) | |

(52) U.S. Cl.
CPC .............. *H05K 1/0296* (2013.01); *G03C 1/005* (2013.01); *G03C 5/29* (2013.01); *G03F 7/06* (2013.01); *G03F 7/0957* (2013.01); *H05K 1/0259* (2013.01)

(58) Field of Classification Search
CPC ............ G03C 1/005; G03C 1/76; G03C 5/29; G03F 7/06; G03F 7/0957; H05K 1/0296; H05K 1/0259
USPC ......... 430/264, 416, 432, 434, 495, 496, 510, 430/523, 567; 174/257
See application file for complete search history.

(56) References Cited

U.S. PATENT DOCUMENTS

| | | | |
|---|---|---|---|
| 3,464,822 A | | 9/1969 | Blake |
| 4,596,764 A | | 6/1986 | Ishimaru |
| 4,640,890 A | | 2/1987 | Fujita et al. |
| 5,550,010 A | | 8/1996 | Bredoux et al. |
| 7,026,079 B2 | | 4/2006 | Louwet et al. |
| 7,537,800 B2 | | 5/2009 | Sasaki et al. |
| 7,829,270 B2 | | 11/2010 | Nakahira |
| 7,934,966 B2 | | 5/2011 | Sasaki et al. |
| 7,943,291 B2 | | 5/2011 | Tokunaga et al. |
| 7,985,527 B2 | | 7/2011 | Tokunaga |
| 8,012,676 B2 | | 9/2011 | Yoshiki et al. |
| 8,043,800 B2 | | 10/2011 | Naoi |
| 8,658,907 B2* | | 2/2014 | Ichiki ............................ 174/257 |
| 8,722,314 B2* | | 5/2014 | Kuriki ............................ 430/320 |
| 2004/0229028 A1 | | 11/2004 | Sasaki et al. |
| 2009/0233247 A1 | | 9/2009 | Zengerle et al. |
| 2011/0289771 A1 | | 12/2011 | Kuriki |
| 2011/0308846 A1 | | 12/2011 | Ichiki |
| 2013/0163074 A1 | | 6/2013 | Lee et al. |

FOREIGN PATENT DOCUMENTS

| | | |
|---|---|---|
| EP | 0 520 394 A2 | 12/1992 |
| JP | 2006-228836 | 8/2006 |
| JP | 2011-210579 | 10/2011 |
| WO | WO 01/96951 A1 | 12/2001 |
| WO | WO 02/093256 A1 | 11/2002 |

* cited by examiner

Primary Examiner — Geraldina Visconti
(74) Attorney, Agent, or Firm — J. Lanny Tucker

(57) ABSTRACT

A conductive film element precursor can be used to provide conductive silver lines from silver halide in a non-color hydrophilic photosensitive layer. This precursor has a substrate having, in order on at least one supporting side: a non-color hydrophilic photosensitive layer comprising a silver halide at a coverage of less than 5000 mg Ag/m$^2$, and a hydrophilic overcoat disposed over the non-color hydrophilic photosensitive layer. This hydrophilic overcoat is the outermost layer and comprises silver halide in an amount of at least 5 mg Ag/m$^2$ and up to and including 150 mg Ag/m$^2$. The noted hydrophilic layers can be disposed on both supporting sides of the substrate to form a duplex conductive film element precursor. After imagewise exposure, the resulting exposed silver halide is developed and fixed to provide silver metal in conductive lines on either or both supporting sides of the substrate.

19 Claims, No Drawings

SILVER HALIDE CONDUCTIVE ELEMENT PRECURSOR AND DEVICES

RELATED APPLICATIONS

Reference is made to U.S. Ser. No. 13/771,549 filed Feb. 20, 2013 by Sanger and Scaglione, now abandoned; and U.S. Ser. No. 13/919,203 filed Jun. 17, 2013 by Gogle, Lowe, O'Toole, and Youngblood, the disclosure of which is incorporated herein by reference.

FIELD OF THE INVENTION

This invention relates to a silver halide containing conductive film element precursor that can be used to prepare a conductive element for use in various display devices. This invention also relates to a method for using this conductive film element precursor to provide a conductive film element containing silver.

BACKGROUND OF THE INVENTION

Rapid advances are occurring in various electronic devices especially display devices that are used for various communicational, financial, and archival purposes. For such uses as touch screen panels, electrochromic devices, light emitting diodes, field effect transistors, and liquid crystal displays, conductive films are essential and considerable efforts are being made in the industry to improve the properties of those conductive films.

There is a particular need to provide touch screen displays and devices that contain improved conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. These smaller segments require additional driving and sensing electronics. In addition ITO is a ceramic material, is not readily bent or flexed, and requires vacuum deposition with high processing temperatures to prepare the conductive layers.

Silver is an ideal conductor having conductivity 50 to 100 times greater than ITO. Unlike most metal oxides, silver oxide is still reasonably conductive and this reduces the problem of making reliable electrical connections. Silver is used in many commercial applications and is available from numerous sources. It is highly desirable to make conductive film elements using silver as the source of conductivity, but it requires considerable development to obtain the optimal properties.

U.S. Patent Application Publication 2011/0308846 (Ichiki) describes the preparation of conductive films formed by reducing a silver halide image in conductive networks with silver wire sizes less than 10 µm, which conductive films can be used to form touch panels in displays.

In addition, U.S. Pat. No. 3,464,822 (Blake) describes the use of a silver halide emulsion in a photographic element to form a conductive silver surface image by development and one or more treatment baths after development.

Improvements have been proposed for providing conductive patterns using photosensitive silver salt compositions such as silver halide emulsions as described for example in U.S. Pat. No. 8,012,676 (Yoshiki et al.). Such techniques involve the treatment using hot water baths containing reducing agents or halides.

U.S. Pat. No. 7,943,291 (Tokunaga et al.) describes photosensitive materials that can be used to prepare conductive silver-containing films. One or more layers for example an outermost protective layer can include various conductive fine particles such as metal oxide particles in a binder.

Thus, it is known to provide conductive silver patterns on transparent films and to put protective non-photosensitive overcoats over those conductive silver patterns. While known protective non-photosensitive overcoats provide physical protection for the conductive patterns, they also act as an insulating barrier between the conductive pattern and external electrical contacts used in a various display devices. Such insulating properties can render display device manufacture unreliable.

Thus, there is a need to create conductive patterns in conductive articles designed for display devices in which a protective non-photosensitive overcoat has finite electrical conductivity only in the direction perpendicular to the surface of the conductive article used as a touch screen sensor film. Such a protective non-photosensitive overcoat would enable effective electrical contact between external electrical circuits and underlying conductive silver patterns. Conductivity in the two in-plane directions must be avoided to prevent cross-talk between circuitry elements. It with these needs in mind, that the present invention was discovered.

SUMMARY OF THE INVENTION

To address the problems noted above, the present invention provides a conductive film element precursor comprising a substrate having a first supporting side and an opposing second supporting side, and the conductive film element precursor comprising, in order on the first supporting side the substrate:

a first non-color hydrophilic photosensitive layer comprising a silver halide at a coverage of less than 5000 mg Ag/m$^2$, and a first hydrophilic overcoat disposed over the first non-color hydrophilic photosensitive layer, which first hydrophilic overcoat is the outermost layer on the first supporting side of the substrate, and the first hydrophilic overcoat comprises silver halide in an amount of at least 5 mg Ag/m$^2$ and up to and including 150 mg Ag/m$^2$.

In addition, the present invention provides a method for providing a conductive film element, comprising:

imagewise exposing a conductive film element precursor comprising
a substrate having a first supporting side and an opposing second supporting side, and the conductive film element precursor comprising, in order on the first supporting side of the substrate:
a first non-color hydrophilic photosensitive layer comprising a silver halide at a coverage of less than 5000 mg Ag/m$^2$, and
a first hydrophilic overcoat disposed over the first non-color hydrophilic photosensitive layer, which first hydrophilic overcoat is the outermost layer on the first supporting side of the substrate, and the first hydrophilic overcoat comprises silver halide in an amount of at least 5 mg Ag/m$^2$ and up to and including 150 mg Ag/m$^2$,
to provide a latent pattern containing silver halide in the first non-color hydrophilic photosensitive layer, converting the silver halide in the latent pattern to silver metal (or nuclei) by contacting the exposed conductive film element precursor with a developing solution comprising a silver halide developing agent, removing unconverted silver halide from the first non-color hydrophilic photosensitive layer, leaving silver metal in a pattern corresponding to the latent pattern, and optionally further treating the silver metal (or nuclei) in the pattern to enhance its conductivity.

In many embodiments of method of the present invention, the conductive film element precursor further comprises on the opposing second supporting side of the substrate, a second non-color hydrophilic photosensitive layer and a second hydrophilic overcoat disposed over the second non-color hydrophilic photosensitive layer, the second hydrophilic overcoat being the outermost layer on the opposing second supporting side of the substrate, the method further comprising:

imagewise exposing the second non-color hydrophilic photosensitive film to provide a second latent pattern containing silver halide in the second non-color hydrophilic photosensitive layer, converting the silver halide in the second latent pattern to silver metal during contacting of the exposed conductive film element precursor with the developing solution comprising the silver halide developing agent, removing unconverted silver halide from the second non-color hydrophilic photosensitive layer, leaving silver metal (or nuclei) in a second pattern corresponding to the second latent pattern on the opposing second supporting side of the substrate, and optionally further treating the silver metal (or nuclei) in the second pattern to enhance its conductivity.

The method of this invention can be used to provide a conductive film element comprising:

a substrate having a first supporting side and an opposing supporting side, and comprising on the first supporting side:

a first non-color hydrophilic layer comprising a conductive silver pattern, and a first hydrophilic overcoat disposed over the first non-color hydrophilic layer, which first hydrophilic overcoat is the outermost layer on the first supporting side of the substrate, and the first hydrophilic overcoat comprises silver halide in an amount of at least 5 mg Ag/m$^2$ and up to and including 150 mg Ag/m$^2$.

As described further below, some embodiments of these conductive film elements can have a second non-color hydrophilic layer comprising a conductive silver pattern, and a second hydrophilic overcoat as defined below, on the opposing second supporting side of the substrate.

Thus, the second hydrophilic overcoat is disposed over the second non-color hydrophilic layer, which second hydrophilic overcoat is an outermost layer on the opposing second supporting side of the substrate, and the second hydrophilic overcoat comprises silver halide in an amount of at least 5 mg Ag/m$^2$ and up to and including 150 mg Ag/m$^2$.

The present invention provides conductive articles that can be incorporated into display devices such as touch screens to provide various advantages. These advantages are provided by incorporating an anisotropically conductive overcoat over the conductive silver patterns on one or both sides of a transparent substrate. This unique anisotropically conductive overcoat is created from a hydrophilic overcoat comprising a silver halide emulsion having specific characteristics and coating density so that this silver halide is converted to silver metal only when the underlying silver halide emulsion used to form the conductive silver pattern is exposed and converted to silver metal. In other words, the silver halide in the hydrophilic overcoat and the silver halide emulsion in the conductive pattern forming layer have similar sensitivity so that the same exposure energy can be used to properly expose both silver halides, providing only anisotropic silver linkages in the exposed conductive pattern.

For example, these advantages are best achieved when the exposure sensitivity of the silver halide emulsion in the hydrophilic overcoat is between 10% and 200% of the optimum sensitivity of the underlying non-color photosensitive silver halide emulsion used to provide the conductive silver pattern, as expressed as µJ/m$^2$.

Moreover, the size of the silver halide grains used in the hydrophilic overcoat can be designed so that the exposed and developed silver metal can form a silver column between the top surface of the conductive film element and the underlying conductive silver pattern. For example, this can be achieved if the effective spherical diameter (ESD) of the non-developed silver halide grains in the hydrophilic overcoat is approximately equal to the dry thickness of the hydrophilic overcoat, meaning that the grain ESD to dry thickness ratio is from 0.25:1 to and including 1.75:1, or more likely from 0.5:1 to 1.25:1.

It is also desirable that the grain surface density of the silver halide in the hydrophilic overcoat is low enough to minimize the formation of conductive pathways in the imaged and resulting silver in the hydrophilic overcoat. For example, this is possible when the coating density of the silver halide grains in the hydrophilic overcoat is at least $1 \times 10^{10}$ grains/m$^2$ and up to and including $1 \times 10^{12}$ grains/m$^2$.

All of these properties can thus be adjusted using the components and compositions described below to achieve the desired properties in the resulting conductive film elements.

DETAILED DESCRIPTION OF THE INVENTION

Definitions

As used herein to define various components of the non-color hydrophilic photosensitive layers, hydrophilic overcoats, and any processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, solution, or the % of the dry weight of a layer. Unless otherwise indicated, the percentages can be the same for either a dry layer or pattern, or for the total solids of the formulation or composition used to make that layer or pattern.

A "conductive film element precursor" (or "precursor") is meant to refer to an article or element of this invention that is used to provide the conductive film element of the present invention. Such conductive film element precursor therefore comprise a precursor to the silver metal particles, such as a silver halide as described below that is suitably converted (for example by reduction) to silver metal. Much of the discussion about the conductive film element precursors is equally applicable to the conductive film elements as most of the components and structure are not changed when silver cations in a silver halide are converted to silver metal. Thus, unless otherwise indicated, the discussion of substrates, hydrophilic binders and colloids, and other addenda in silver halide layers and hydrophilic overcoats for the conductive film element precursors are also intended to describe the components of the resulting conductive film elements.

Unless otherwise indicated, the terms "conductive film element" and "conductive article" are intended to mean the same thing. They refer to the materials containing a hydrophilic layer comprising conductive silver metal disposed on a suitable substrate. Other components of the article or conductive film element are described below.

The term "first" refers to the layers on one supporting side of the substrate and the term "second" refers to the layers on the opposing (opposite) side of the substrate. Each supporting side of the substrate can be equally useful and the term "first" does not necessarily mean that that side is the primary or better supporting side of the support.

The term "duplex" is used herein in reference to conductive film element precursors and conductive film elements having the described layers on both supporting sides of the substrate. Unless otherwise indicated herein, the relationships and compositions of the various layers can be the same or different on both supporting sides of the substrate.

ESD refers to "equivalent spherical diameter" and is a term used in the photographic art to define the size of particles such as silver halide grains. Particle size of silver halide grains as expressed in grain ESD can be readily determined using disc centrifuge instrumentation.

Uses

The conductive film element precursors of this invention can be used in many ways to form conductive film elements comprising a conductive silver metal pattern on a suitable substrate. These conductive film elements can be used as devices themselves or they can be used as components in devices having a variety of applications including but not limited to, electronic, optical, sensory, and diagnostic uses. More details of such uses are provided below. In particular, it is desired to use the conductive film element precursors of the present invention to provide highly conductive silver metal patterns comprising lines having a line resolution (line width) of less then 50 μm, or less than 15 μm, or even less than 10 μm and as low as 1 μm.

It is particularly useful to use conductive film elements comprising conductive silver patterns on first and opposing second supporting sides of the substrate.

Such electronic and optical devices and components include but are not limited to, radio frequency tags (RFID), sensors, touch screen displays, and memory and back panel displays.

Conductive Film Element Precursors

The conductive film element precursors of this invention are photosensitive but do not contain chemistry to provide color photographic images. Thus, these "precursors" are considered to be black-and-white photosensitive materials and non-color image-forming.

In most embodiments, the conductive film element precursors and the resulting conductive film elements, including the substrate and all accompanying layers on one or both supporting sides, are considered transparent meaning that the cumulative transmittance in the entire visible region of the electromagnetic spectrum (for example from 400 nm to 750 nm) through the entire element is 70% or more, or more likely at least 85% or even 90% or more.

Conductive film element precursors having the same or different essential layers on both supporting sides of the substrate can be known as "duplex" or "two-sided" conductive film element precursors.

The conductive film element precursor can be formed by providing a first non-color (that is, black-and-white) hydrophilic photosensitive layer on at least one supporting or planar side (as opposed to non-supporting edges) of a suitable substrate in a suitable manner. This first non-color hydrophilic photosensitive layer comprises a silver halide, or a mixture of silver halides, at a total silver coverage of at least 2500 mg Ag/m$^2$, or at least 3500 mg Ag/m$^2$ and less than 5000 mg Ag/m$^2$, for example up to and including 4900 mg Ag/m$^2$. Thus, this non-color hydrophilic photosensitive layer has sufficient silver halide and sufficient sensitization to be photosensitive to selected imaging irradiation (described below).

The one or more silver halides are dispersed within one or more suitable hydrophilic binders or colloids as described below also.

Such conductive film element precursors are therefore treated in such a manner as to convert the silver cations (such as by reduction) into silver metal, and this element can then become a conductive film element of the present invention after appropriate treatment or processing steps. Alternatively, the conductive film element precursor can be treated in a suitable manner as to convert the silver cations into silver metal, and this silver metal is then removed from the treated conductive film element precursor and incorporated onto another substrate that is then treated to form a conductive film element of the present invention.

Thus, the conductive film element precursors of this invention consist essentially of two essential layers on each supporting side (or planar surface) of the substrate, that is a non-color hydrophilic photosensitive layer disposed on the substrate and a hydrophilic overcoat disposed directly on the non-color hydrophilic photosensitive layer. These essential layers can be disposed on only one supporting side of the substrate, or they can be disposed on both first supporting and opposing second supporting sides of the substrate, in the same order. Optional layers can also be present on either or both supporting sides and are described below but they are not essential to achieve the desired advantages of the present invention.

Substrates:

While silver metal particles can be provided in a number of ways, in the present invention, silver metal particles are provided from one or more silver halides in a coated non-color photographic, first hydrophilic photosensitive layers or dispersions (for example, black-and-white silver halide emulsions). This layer is disposed in a suitable manner on one or both supporting sides (planar surfaces) of a substrate. The choice of substrate generally depends upon the intended utility of the resulting conductive film element precursor, and can be any substrate on which a conductive silver film, grid, element, or pattern is desired. It can be rigid or flexible, and generally transparent as described above. For example, the substrate can be a transparent, flexible substrate having a transmittance of at least 80% and generally at least 95%. Suitable substrates include but are not limited to, glass, glass-reinforced epoxy laminates, cellulose triacetate, acrylic esters, polycarbonates, adhesive-coated polymer substrates, polymer substrates (such as polyester films), and composite materials. Suitable polymers for use as polymer substrates include but are not limited to, polyethylene, polyesters such as polyethylene terephthalate (PET) and polyethylene naphthalate (PEN), polypropylenes, polyvinyl acetates, polyurethanes, polyamides, polyimides, polysulfones, and mixtures thereof. Polymeric substrates can also comprise two or more layers of the same or different or polymeric composition so that the composite substrate (or laminate) has the same or different layer refractive properties. The substrate can be treated on either or both supporting sides to improve adhesion of a silver salt emulsion or dispersion to one or both supporting sides of the substrate. For example, the substrate can be coated with a polymer adhesive layer or one or both supporting sides can be chemically treated or subjected to a corona treatment.

The most useful substrates are transparent to facilitate transparency of the entire material. Thus, the substrate transparency is particularly high such as least 95% in the visible region of the electromagnetic spectrum (for example at least 400 nm and up to and including 750 nm). It is possible for the substrate to be slightly colored as long as the desired transparency is preserved.

Commercially available oriented and non-oriented polymer films, such as opaque biaxially oriented polypropylene or polyester, can also be used. Such substrates can contain pigments, air voids or foam voids to enhance opacity if desired. The substrate can also comprise microporous materials such as polyethylene polymer-containing material sold by PPG Industries, Inc., Pittsburgh, Pa. under the trade name of Teslin®, Tyvek® synthetic paper (DuPont Corp.) and other composite films listed in U.S. Pat. No. 5,244,861 (Campbell et al.). Useful composite sheets are also disclosed in, for example, U.S. Pat. No. 4,377,616 (Ashcraft et al.), U.S. Pat. No. 4,758,462 (Park et al.), and U.S. Pat. No. 4,632,869 (Park et al.).

The substrate also can be voided, which means it contains voids formed as interstitial voids using added solid and liquid materials, or "voids" containing a gas. The void-initiating particles, which remain in the finished packaging sheet core, should be from at least 0.1 and up to and including 10 µm in diameter and typically round in shape to produce voids of the desired shape and size. Some commercial microvoided products are commercially available as 350K18 from ExxonMobil and KTS-107 (from HSI, South Korea).

Biaxially oriented sheets, while described as having at least one layer, can also be provided with additional layers that can serve to change the optical or other properties of the biaxially oriented sheet. Such layers might contain tints, antistatic or conductive materials, or slip agents to produce sheets of unique properties. The biaxially oriented extrusion can be carried out with as many as 10 layers if desired to achieve some particular desired property. The biaxially oriented sheet can be made with layers of the same polymeric material, or it can be made with layers of different polymeric composition.

Useful transparent substrates can be composed of cellulose derivatives such as a cellulose ester, cellulose triacetate, cellulose diacetate, cellulose acetate propionate, cellulose acetate butyrate, polyesters such as poly(ethylene terephthalate), poly(ethylene naphthalate), poly-1,4-cyclohexanedimethylene terephthalate, poly(butylene terephthalate), and copolymers thereof, polyintides, polyamides, polycarbonates, polystyrene, polyolefins, such as polyethylene or polypropylene, polysulfones, polyacrylates, polyether imides, and mixtures thereof.

Particularly useful substrates for the manufacture of flexible electronic devices or touch screen components are flexible, which feature aids rapid roll-to-roll application. Estar® poly(ethylene terephthalate) films and cellulose triacetate films are particularly useful materials for making flexible transparent substrates for this invention.

The substrate can be the same as a support or film that is already incorporated into a flexible display device, by which it is meant that essential layers described herein are applied to a substrate material within a display device and imaged in situ according to a desired pattern, and then processed in situ.

Where a discrete substrate is utilized (that is, the substrate is not already incorporated in a flexible display device), the essential layers (from formulations) are applied to one or both supporting sides thereof. If different patterns (or grids) are intended for each supporting side, the substrate or optional intervening filter (or antihalation) layers comprising filter dyes can be provided to prevent light exposure from one side reaching the other. Alternatively, the silver halide emulsions can be sensitized differently for the opposing non-color hydrophilic photosensitive layers on opposing supporting sides of the substrate.

The substrate used in the conductive film element precursor can have a thickness of at least 20 µm and up to and including 300 µm or typically at least 75 µm and up to and including 200 µm. Antioxidants, brightening agents, antistatic or conductive agents, plasticizers, and other known additives can be incorporated into the substrate, if desired, in amounts that would be readily apparent to one skilled in the art.

Non-Color Hydrophilic Photosensitive Layers:

The essential silver halide(s) in these layers comprise silver cations of one or more silver halides that can be converted into silver metal according to a desired pattern upon photo-exposure of each non-color hydrophilic photosensitive layer in an imagewise fashion. The latent image can then be developed into a silver metal image using known silver development procedures and chemistry (described below). The silver halide (or combination of silver halides) is photosensitive, meaning that radiation from UV to visible light (for example, of at least 100 nm and up to and including 750 nm radiation) is generally used to convert silver cations to silver metal in a latent image. In some embodiments, the silver halide is present with a thermally-sensitive silver salt (such as silver behenate) and the non-color photosensitive hydrophilic layer can be both photosensitive and thermally sensitive (sensitive to imaging thermal energy such as infrared radiation).

The useful photosensitive silver halides can be, for example, silver chloride, silver bromide, silver chlorobromoiodide, silver bromochloroiodide, silver chlorobromide, silver bromochloride, or silver bromoiodide that are prepared as individual compositions (or emulsions). The various halides are listed in the silver halide name in descending order of halide amount. In addition, individual silver halide emulsions can be prepared and mixed to form a mixture of silver halide emulsions that are used on the same or different supporting sides of the substrate. In general, the useful silver halides comprise up to and including 100 mol % of chloride or up to and including 100 mol % of bromide, and up to and including 5 mol % iodide, all based on total silver. These silver halides are generally known as "high chloride" or "high bromide" silver halides and are used to form "high chloride", or "high bromide" emulsions, respectively. Particularly useful silver halides comprise at least 50 mol % and up to and including 100 mol % bromide and the remainder is either or both of chloride or iodide, based on the total silver.

The silver halide grains used in each non-color hydrophilic photosensitive layer generally have an ESD of at least 30 nm and up to and including 300 nm, or more likely at least 50 nm and up to and including 200 nm.

The coverage of total silver in the silver halide(s) in each non-color hydrophilic photosensitive layer is at least 2500 mg Ag/m$^2$ and typically at least 3500 mg Ag/m$^2$ and less than 5000 mg Ag/m$^2$, for example up to and including 4900 mg Ag/m$^2$. These amounts of silver halide are then converted by the processes described below to at least 2500 mg Ag/m$^2$ and less than 5000 mg Ag/m$^2$, or at least 3500 mg Ag/m$^2$ and up to and including 4900 mg Ag/m$^2$, in each conductive layer on each or both sides of the substrate in the resulting conductive film elements.

The dry thickness of each non-color hydrophilic photosensitive layer is generally at least 0.1 μm and up to and including 10 μm, and particularly at least 0.1 μm and up to and including 5 μm.

The final dry non-color hydrophilic photosensitive layer can be made up of one or more individually coated non-color hydrophilic photosensitive sub-layers that can be applied using the same or different silver halide emulsion formulations. Each sub-layer can be composed of the same or different silver halide(s), hydrophilic binders or colloids, and addenda. The sub-layers can have the same or different amount of silver content.

The photosensitive silver halide(s) used in the first non-color hydrophilic photosensitive layer can be the same or different as the photosensitive silver halide(s) used in the opposing second supporting side non-color hydrophilic photosensitive layer.

The photosensitive silver halide grains (and any addenda associated therewith as described below) are dispersed (generally uniformly) in one or more suitable hydrophilic binders or colloids to form a hydrophilic silver halide emulsion that can be applied to form a non-color hydrophilic photosensitive layer. Examples of such hydrophilic binders or colloids include but are not limited to, hydrophilic colloids such as gelatin and gelatin derivatives, polyvinyl alcohol (PVA), poly(vinyl pyrrolidone) (PVP), casein, and mixtures thereof. Suitable hydrophilic colloids and vinyl polymers and copolymers are also described in Section IX of *Research Disclosure* Item 36544, September 1994 that is published by Kenneth Mason Publications, Emsworth, Hants, PO10 7DQ, UK. A particularly useful hydrophilic colloid is gelatin or a gelatin derivative of which several are known in the art.

The amount of hydrophilic binder or colloid in each non-color hydrophilic photosensitive layer can be adapted to the particular dry thickness that is desired as well as the amount of silver halide that is incorporated. It can also be adapted to meet desired dispersibility and layer adhesion to the substrate. In general, the one or more hydrophilic binders or colloids are present in an amount of at least 10 weight % and up to and including 95 weight % based on the total solids in the emulsion formulation or dry layer.

One useful non-color hydrophilic photosensitive layer composition has a relatively high silver ion/low hydrophilic binder (for example, gelatin) weight ratio. For example, a particularly useful weight ratio of silver ions (and eventually silver metal) to hydrophilic binder or colloid such as gelatin (or its derivative) is at least 0.1:1, or even at least 1.5:1 and up to and including 10:1. A particularly useful weight ratio of silver ions to the hydrophilic binder or colloid can be at least 2:1 and up to and including 5:1. Other weight ratios can be readily adapted for a particular use and dry layer thickness.

In some embodiments, the hydrophilic binder or colloid is used in combination with one or more hardeners designed to harden the particular hydrophilic binder such as gelatin. Particularly useful hardeners for gelatin and gelatin derivatives include but are not limited to, non-polymeric vinyl-sulfones such as bis(vinyl-sulfonyl) methane (BVSM), bis(vinyl-sulfonyl methyl) ether (BVSME), and 1,2-bis(vinyl-sulfonyl acetamide)ethane (BVSAE). Mixtures of hardeners can be used if desired. The hardeners can be incorporated into each non-color hydrophilic photosensitive layer in any suitable amount that would be readily apparent to one skilled in the art.

In general, each non-color hydrophilic photosensitive layer can have a swell ratio of at least 150% as determined by optical microscopy of element cross-sections.

In many embodiments, the useful silver halide described above is sensitized to any suitable wavelength of exposing radiation. Organic sensitizing dyes can be used, but it can be advantageous to sensitize the silver salt to the UV portion of the electromagnetic spectrum without using visible light sensitizing dyes to avoid unwanted dye stains if the article containing the silver metal particles is intended to be transparent.

Non-limiting examples of addenda useful to be included with the silver halides, including chemical and spectral sensitizers, filter dyes, organic solvents, thickeners, dopants, emulsifiers, surfactants, stabilizers, hardeners, and antifoggants are described in Research Disclosure Item 36544, September 1994 and the many publications identified therein. Such materials are well known in the art and it would not be difficult for a skilled artisan to formulate or use such components for purposes described herein. Some useful silver salt emulsions are described, for example in U.S. Pat. No. 7,351,523 (Grzeskowiak), U.S. Pat. No. 5,589,318, and U.S. Pat. No. 5,512,415 (both to Dale et al.).

Useful silver halide emulsions containing silver halide grains that can be reduced to silver metal particles can be prepared by any suitable method of grain growth, for example, by using a balanced double run of silver nitrate and salt solutions using a feedback system designed to maintain the silver ion concentration in the growth reactor. Known dopants can be introduced uniformly from start to finish of precipitation or can be structured into regions or bands within the silver halide grains. Useful dopants include but are not limited to, osmium dopants, ruthenium dopants, iron dopants, rhodium dopants, iridium dopants, and cyanoruthenate dopants. A combination of osmium and iridium dopants such as a combination of osmium nitrosyl pentachloride and iridium dopant is useful. Such complexes can be alternatively utilized as grain surface modifiers in the manner described in U.S. Pat. No. 5,385,817 (Bell). Chemical sensitization can be carried out by any of the known silver halide chemical sensitization methods, for example using thiosulfate or another labile sulfur compound, or in combination with gold complexes.

Useful silver halide grains can be cubic, octahedral, rounded octahedral, polymorphic, tabular, or thin tabular emulsion grains. Such silver halide grains can be regular untwinned, regular twinned, or irregular twinned with cubic or octahedral faces. In one embodiment, the silver halide grains are cubic having an edge length of less than 0.5 μm and at least 0.05 μm.

Specific references relating to the preparation of emulsions of differing halide ratios and morphologies are U.S. Pat. No. 3,622,318 (Evans); U.S. Pat. No. 4,269,927 (Atwell); U.S. Pat. No. 4,414,306 (Wey et al.); U.S. Pat. No. 4,400,463 (Maskasky); U.S. Pat. No. 4,713,323 (Maskasky); U.S. Pat. No. 4,804,621 (Tufano et al.); U.S. Pat. No. 4,783,398 (Takada et al.); U.S. Pat. No. 4,952,491 (Nishikawa et al.);

U.S. Pat. No. 4,983,508 (Ishiguro et al.); U.S. Pat. No. 4,820,624 (Hasebe et al.); U.S. Pat. No. 5,264,337 (Maskasky); U.S. Pat. No. 5,275,930 (Maskasky); U.S. Pat. No. 5,320,938 (House et al.); U.S. Pat. No. 5,550,013 (Chen et al.); U.S. Pat. No. 5,726,005 (Chen et al.); and U.S. Pat. No. 5,736,310 (Chen et al.).

Antifoggants and stabilizers can be added to give the silver halide emulsion the desired sensitivity, if appropriate. Antifoggants that can be used include, for example, azaindenes such as tetraazaindenes, tetrazoles, benzotriazoles, imidazoles and benzimidazoles. Specific antifoggants that can be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole, and benzotriazole, individually or in combination.

The essential silver halide grains and hydrophilic binders or colloids, and optional addenda can be formulated and coated as a silver halide emulsion using suitable emulsion solvents including water and water-miscible organic solvents. For example, useful solvents for making the silver halide emulsion or coating formulation can be water, an alcohol such as methanol, a ketone such as acetone, an amide such as formamide, a sulfoxide such as dimethyl sulfoxide, an ester such as ethyl acetate, or an ether, or combinations of these solvents. The amount of one or more solvents used to prepare the silver halide emulsions can be at least 30 weight % and up to and including 50 weight % of the total formulation weight. Thus, such coating formulations can be prepared using any of the photographic emulsion making procedures that are known in the art.

Hydrophilic Overcoats

Disposed over each non-color hydrophilic photosensitive layer, on either or both supporting sides of the substrate, is a hydrophilic overcoat. This hydrophilic overcoat is the outermost layer in the conductive film element precursor (that is, there are no layers purposely placed over it on either or both supporting sides of the substrate). Thus, generally if both supporting sides of the substrate are used to provide a conductive silver pattern, then a hydrophilic overcoat is present on both supporting sides of the substrate. Thus, a first hydrophilic overcoat is disposed over the first non-color hydrophilic photosensitive layer, and a second hydrophilic overcoat is disposed over a second non-color second hydrophilic photosensitive layer on the opposing supporting side of the substrate. In most embodiments, each hydrophilic overcoat is directly disposed on each non-color hydrophilic photosensitive layer, meaning that there are no intervening layers on the supporting sides of the substrate. The chemical compositions and dry thickness of these hydrophilic overcoats can be the same or different, but in most embodiments they have essentially the same chemical composition and dry thickness.

Each hydrophilic overcoat (first or second, or both) comprises one or more silver halides in the same or different amount so as to provide silver metal (nuclei), after exposure and processing, in an amount of at least 5 mg Ag/m$^2$ and up to and including 150 mg Ag/m$^2$, or at least 5 mg Ag/m$^2$ and up to and including 75 mg Ag/m$^2$.

This silver halide is dispersed (generally uniformly) within one or more hydrophilic binders or colloids in each hydrophilic overcoat, which hydrophilic binders or colloids include those described above for the non-color hydrophilic photosensitive layers. In many embodiments, the same hydrophilic binders or colloids can be used in all of the layers of the conductive film element precursor. However, different hydrophilic binders or colloids can be used in the various layers, and on either or both supporting sides of the substrate. The amount of one or more hydrophilic binders or colloids in each hydrophilic overcoat is the same or different and generally at least 50 weight % and up to and including 97 weight %, based on total hydrophilic overcoat thy weight.

Each hydrophilic overcoat can also comprise one or more hardeners for a hydrophilic binder or colloid (such as gelatin or a gelatin derivative). Useful hardeners are described above.

It is also possible that the silver halide(s) in each hydrophilic overcoat is the same as the silver halide(s) in each non-color hydrophilic photosensitive layer over which it is disposed.

Moreover, the one or more silver halides in each hydrophilic overcoat has a grain ESD of at least 100 nm and up to and including 1000 nm, or at least 150 nm and up to and including 600 nm.

In some embodiments, the one or more silver halides in each hydrophilic overcoat has a grain ESD that is larger than the grain ESD of the silver halide in the non-color hydrophilic photosensitive layer over which it is disposed.

The dry thickness of the each hydrophilic overcoat is at least 100 nm and up to and including 800 nm, or more particularly at least 300 nm and up to and including 500 nm. In many embodiments, the grain ESD to dry thickness ratio in the hydrophilic overcoat is from 0.25:1 to and including 1.75:1 or more likely from 0.5:1 to and including 1.25:1.

In various embodiments, the silver halide(s) in each hydrophilic overcoat comprises up to 100 mol % bromide or up to 100 mol % chloride, and up to and including 3 mol % iodide, all molar amounts based on total silver content.

In other embodiments, the silver halide(s) in each hydrophilic overcoat comprises more chloride than the silver halide in the non-color hydrophilic photosensitive layer over which it is disposed. This relationship can be the same or different on both supporting sides of the substrate in such "duplex" conductive film element precursors.

In useful embodiments, the silver halide(s) in each hydrophilic overcoat comprises at least 80 mol % bromide, and the remainder is chloride or iodide, based on total silver content, and the silver halide(s) in the non-color hydrophilic photosensitive layer over which it is disposed has at least 80 mol % bromide, and the remainder is iodide or chloride, all based on total silver content.

As is known in the art, one or both hydrophilic overcoats can include one or more spectral sensitizers that are sensitive to actinic radiation, which spectral sensitizers are well known in the art.

It is also useful in conductive film element precursors of the present invention that the silver halide(s) in the each hydrophilic overcoat and the silver halide(s) in each non-color hydrophilic photosensitive layer over which it is disposed are matched in photographic speed. This is best achieved when the exposure sensitivity of the silver halide emulsion(s) in the hydrophilic overcoat is at least 10% and up to and including 200% of the optimum sensitivity of silver halide emulsion in the underlying non-color hydrophilic photosensitive layer used to provide the conductive silver pattern, as expressed in µJ/m$^2$.

Additional Layers:

In addition to the two essential layers and components described above on one or both supporting sides of the substrate, the conductive film element precursor and conductive film elements of this invention can also include other layers that are not essential but can provide some additional properties or benefits, such as light absorbing filter layers, adhesion layers, and other layers as are known in the photographic art. The light absorbing filter layers can also be known as "antihalation" layers that can be located between the essential layers on each supporting side of the substrate. For example, each supporting side can have a light absorbing filter layer disposed directly on it, and directly disposed underneath the non-color hydrophilic photosensitive layer.

Light absorbing filter layers can include one or more filter dyes that absorb in the UV, red, green, or blue regions of the electromagnetic spectrum, or any combination thereof, and such light absorbing filter layers can be on located between the substrate and the non-color hydrophilic photosensitive layer on each or both supporting sides of the substrate.

For example, the conductive film element precursor can comprise an UV absorbing layer between a first supporting side of the substrate and the first non-color hydrophilic photosensitive layer.

The duplex embodiments of the conductive film element precursors further comprise on the opposing second supporting side of the substrate, a second non-color hydrophilic photosensitive layer and a second hydrophilic overcoat disposed over the second non-color hydrophilic photosensitive layer. An UV absorbing layer can be disposed between the or opposing second supporting side of the substrate and the second non-color hydrophilic photosensitive layer, which UV absorbing layer can be the same as or different from the UV absorbing layer on the first supporting side of the substrate.

In many duplex embodiments, the second non-color hydrophilic photosensitive layer and the second hydrophilic overcoat have the same composition as the first non-color hydrophilic photosensitive layer and the first hydrophilic overcoat, respectively.

Thus, in some embodiments, the conductive film element precursor can further comprise, on the opposing second supporting side of the substrate, a second non-color hydrophilic photosensitive layer and a second hydrophilic overcoat disposed over the second non-color hydrophilic photosensitive layer.

For example, the second non-color hydrophilic photosensitive layer and the second hydrophilic overcoat can have the same composition as the first non-color hydrophilic photosensitive layer and the first hydrophilic overcoat, respectively.

In other embodiments, the exposure sensitivity of the silver halide emulsion in the first hydrophilic overcoat is at least 10% and up to and including 200% of the optimum sensitivity of the silver halide emulsion in the first non-color hydrophilic photosensitive layer, as expressed as $\mu J/m^2$, and the exposure sensitivity of the silver halide emulsion in the second hydrophilic overcoat is at least 10% and up to and including 200% of the optimum sensitivity of the silver halide emulsion in the second non-color hydrophilic photosensitive layer, as expressed as $\mu J/m^2$. The optimum sensitivities of the respective sides of the substrate can be the same or different.

Preparing Conductive Film Element Precursors

The various layers are formulated using appropriate components and coating solvents and are applied to one or both supporting sides of a suitable substrate (as described above) using known coating procedures including those commonly used in the photographic industry (for example, bead coating, blade coating, curtain coating, hopper coating). Each layer can be applied to each supporting side of the substrate in single-pass procedures or simultaneous multi-layer coating procedures.

Providing Conductive Film Elements

The conductive film element precursors of this invention are provided for use in the method of this invention and then imagewise exposed to provide a latent silver metal image in the non-color hydrophilic photosensitive layers on the substrate. Imagewise exposure also reduces the silver halide(s) in the hydrophilic overcoat(s) to silver metal in a predetermined pattern.

More commonly, photosensitive silver halides in each non-color hydrophilic photosensitive layer can be imagewise exposed to appropriate actinic radiation (UV to visible radiation) from a suitable source that are well known in the art, and then developed (silver ions reduced to silver nuclei) using known aqueous developing solutions that are commonly used in black-and-white photography. Such developers develop the silver halides in both the exposed non-color hydrophilic photosensitive layers and the hydrophilic overcoats.

Numerous developing solutions (identified also as "developers") are known that can develop the exposed silver halides described above to form silver metal, for example in the form of a grid or pattern corresponding to the imagewise exposure. One commercial silver halide developer that is useful is Accumax® silver halide developer particularly when silver chlorobromide grains are used.

Developing solutions are generally aqueous solutions including one or more silver halide developing agents, of the same or different type, including but not limited to those described in *Research Disclosure* Item 17643 (December, 1978) Item 18716 (November, 1979), and Item 308119 (December, 1989) such as polyhydroxybenzenes (such as dihydroxybenzene, or in its form as hydroquinone, cathecol, pyrogallol, methylhydroquinone, and chlorohydroquinone), aminophenols such as p-methylaminophenol, p-aminophenol, and p-hydroxyphenylglycine, p-phenylenediamines, ascorbic acid and its derivatives, reductones, erythrobic acid and its derivatives, 3-pyrazolidones such as 1-phenyl-4,4-dimethyl-3-pyrazolidone, 1-phenyl-3-pyrazolidone, and 1-phenyl-4-methyl-4-hydroxymethyl-3-pyrazolidone, pyrazolone, pyrimidine, dithionite, and hydroxylamines. These developing agents can be used individually or in combinations thereof. One or more developing agents can be present in known amounts.

The developing solutions can also include auxiliary silver developing agents that exhibit super-additive properties with a developing agent. Such auxiliary developing agents can include but are not limited to, Elon and substituted or unsubstituted phenidones, in known amounts.

Useful developing solutions can also include one or more silver complexing agents (or silver ligands) including but not limited to, sulfite, thiocyanate, thiosulfate, thiourea, thiosemicarbazide, tertiary phosphines, thioethers, amines, thiols, aminocarboxylates, triazolium thiolates, pyridines (including bipyridine), imidazoles, and aminophosphonates, in known amounts.

The developing solutions can also comprise one or more substituted or unsubstituted mercaptotetrazoles in suitable amounts for various purposes. Useful mercaptotetrazoles include but are not limited to, alkyl-, aryl-, and heterocyclyl-substituted mercaptotetrazoles. Examples of such compounds include but are not limited to, 1-phenyl-5-mercaptotetrazole (PMT), 1-ethyl-5-mercaptotetrazole, 1-t-butyl-5-mercaptotetrazole, and 1-pyridinyl-5-mercaptotetrazoles.

Moreover, the developing solution can also include one or more development inhibitors in suitable amounts. Useful development inhibitors include but are not limited to, substituted and unsubstituted benzotriazole compounds such as 5-methylbenzotriazole, imidazoles, benzimidazole thiones, benzathiazole thiones, benzoxazole thiones, and thiazoline thiones.

Other addenda that can be present in the developing solutions in known amounts include but are not limited to, metal chelating agents, preservatives (such as sulfites), antioxidants, small amounts of water-miscible organic solvents (such as benzyl alcohol and diethylene glycol), nucleators, as well as acids, bases (such as alkali hydroxides), and buffers (such as carbonate, borax, phosphates, and other basic salts) to establish a pH of at least 8 and generally of a pH of at least 9.5, or at least 11 and up to and including 14.

Multiple development steps can be used if desired. For example, a first developing solution can provide initial development and then a second developing solution can be used to provide "solution physical development".

Useful development temperatures can range from at least 15° C. and up to and including 60° C. Useful development times can range from at least 10 seconds and up to and including 10 minutes but more likely up to and including 1 minute. The same time or temperature can be used for individual development steps and can be adapted to develop at least 90 mol % of the exposed silver halide. If a prebath solution is not used, the development time can be extended appropriately. The exposed silver halide(s) in each hydrophilic overcoat is also developed during the development step(s). Washing or rinsing can be carried out with water after or between any development steps.

Prebath solutions can also be used to treat the exposed silver salts prior to development. Such solutions can include one or more development inhibitors as described above for the developing solutions, and in the same or different amounts. Effective inhibitors include but are not limited to, benzotriazoles, heterocyclic thiones, and mercaptotetrazoles. The prebath temperature can be in a range as described for development. Prebath time depends upon concentration and the particular inhibitor, but it can range from at least 10 seconds and up to and including 4 minutes.

After development of the exposed silver halide to silver metal, the undeveloped silver halide (in both hydrophilic overcoat and non-color hydrophilic photosensitive layer) is generally removed by treating the developed silver-containing article with a fixing solution. Fixing solutions are well known in the black-and-white photographic art and contain one or more compounds that complex the silver halide for removal from the layers. Thiosulfate salts are commonly used in fixing solutions. The fixing solution can optionally contain a hardening agent such as alum or chrome-alum. The developed film can be processed in a fixing solution immediately after development, or there can be an intervening stop bath or water wash or both. Fixing can be carried out at any suitable temperature and time such as at least 20° C. for at least 30 seconds.

After fixing, the silver metal-containing article can be washed or rinsed in water that can optionally include surfactants or other materials to reduce water spot formation upon drying. Drying can be accomplished in ambient or by heating, for example, in a convection oven at a temperature above 50° C. but below the glass transition temperature of the substrate.

Fixing then leaves the silver metal (or nuclei) in the pattern in each formerly non-color hydrophilic photosensitive layer, which pattern was originally provided by imagewise exposure and corresponding to the latent pattern. Fixing also removes any non-developed silver halide in each hydrophilic overcoat.

After fixing and before drying as described above, the article comprising the conductive silver metal pattern can be further washed or rinsed with water and then treated to further enhance the conductivity of the silver metal (or nuclei) in the pattern on each supporting side of the substrate. A variety of ways have been proposed to carry out this "conductivity enhancement" process. For example, U.S. Pat. No. 7,985,527 (Tokunaga) and U.S. Pat. No. 8,012,676 (Yoshiki et al.) describe treatments using hot water baths, water vapor, reducing agents, or halides. The details of such treatments are provided in these patents that are incorporated herein by reference.

It is also possible enhance conductivity of the silver metal particles by repeated contact with a conductivity enhancing agent, washing, drying, and repeating this cycle of treating, washing, and drying one or more times. Useful conductivity enhancing agents include but are not limited to, sulfites, borane compounds, hydroquinones, p-phenylenediamines, and phosphites. The treatment can be carried out at a temperature of at least 30° C. and up to and including 90° C. for at least 0.25 minute and up to and including 30 minutes.

It can be useful in some embodiments to treat the conductive film element with a hardening bath after fixing and before drying to improve the physical durability of the resulting conductive film element. Such hardening baths can include one or more known hardening agents in appropriate amounts that would be readily apparent to one skilled in the art.

Additional treatments such as with a stabilizing bath can also be carried out before a final drying if desired, at any suitable time and temperature.

The method of this invention can be carried out using a conductive film element precursor comprising on both first and opposing second supporting sides of the substrate, suitable first and second non-color hydrophilic photosensitive layers and first and second hydrophilic overcoats disposed over the first and second non-color hydrophilic photosensitive layers, respectively, the first and second hydrophilic overcoats being the outermost layers on the respective first supporting and opposing second supporting sides of the substrate.

In such methods, both first and second non-color hydrophilic photosensitive layers are appropriately exposed to provide the same or different (usually different) latent patterns containing silver halide in the first and second non-color hydrophilic photosensitive layer. These different exposures can be simultaneous or sequential in manner.

The silver halides in the latent images in the two opposing layers are then converted to silver metal (or nuclei) on both sides during the contacting the exposed conductive film element precursor to the developing solution comprising the silver halide developing agent. Thus, both sides can be developed simultaneously.

Unconverted silver halide can be removed from the first and second non-color hydrophilic photosensitive layers, leaving silver metal in the respective first and second patterns corresponding to the first and second latent patterns on opposing supporting second sides of the substrate.

Optionally and desirably, the silver metal (or nuclei) in the patterns on both sides of the element can be further treated as described above to enhance silver metal conductivity.

Thus, some embodiments of the method of this invention can be used to provide a conductive film element, wherein the conductive film element comprises:

a substrate having a first supporting side and a opposing second supporting side, and comprising on the first supporting side:

a first non-color hydrophilic layer comprising a conductive silver pattern, and a first hydrophilic overcoat disposed over the first non-color hydrophilic layer, which first hydrophilic overcoat is the outermost layer on the first side of the substrate, and the first hydrophilic overcoat comprises silver in an amount of at least 5 mg Ag/m$^2$ and up to and including 150 mg Ag/m$^2$.

In many of these embodiments, the conductive film element further comprises on the opposing second supporting side:
- a second non-color hydrophilic layer comprising a conductive silver pattern, and
- a second hydrophilic overcoat disposed over the second non-color hydrophilic layer, which second hydrophilic overcoat is an outermost layer on the opposing second side of the substrate, and the first hydrophilic overcoat comprises silver in an amount of at least 5 mg Ag/m$^2$ and up to and including 150 mg Ag/m$^2$.

In such embodiments, the conductive silver pattern on the first supporting side of the substrate and the conductive silver pattern on the opposing second supporting side of the substrate can have the same composition.

In many embodiments, the resulting conductive film element has a conductive silver pattern on at least the first supporting side of the substrate and desirably a conductive silver pattern on the opposing second supporting side of the substrate that are different in composition, pattern arrangement, conductive line thickness, or shape of the grid lines (for example, hexagonal, rhombohedral, octagonal, square, or circular). For example, the conductive pattern on the first supporting side of the substrate can have a conductive wire grid in a square pattern, and the conductive wire grid on the opposing supporting second side of the substrate has a diamond pattern.

The present invention provides at least the following embodiments and combinations thereof, but other combinations of features are considered to be within the present invention as a skilled artisan would appreciate from the teaching of this disclosure:

1. A conductive film element precursor comprising a substrate having a first supporting side and an opposing second supporting side, and the conductive film element precursor comprising, in order on the first supporting side the substrate:
   - a first non-color hydrophilic photosensitive layer comprising a silver halide at a coverage of less than 5000 mg Ag/m$^2$, and
   - a first hydrophilic overcoat disposed over the first non-color hydrophilic photosensitive layer, which first hydrophilic overcoat is the outermost layer on the first supporting side of the substrate, and the first hydrophilic overcoat comprises silver halide in an amount of at least 5 mg Ag/m$^2$ and up to and including 150 mg Ag/m$^2$.

2. The conductive film element precursor of embodiment 1, wherein the silver halide in the first hydrophilic overcoat has a grain ESD of at least 100 nm and up to and including 1000 nm.

3. The conductive film element precursor of embodiment 1 or 2, wherein the silver halide in the first non-color hydrophilic photosensitive layer has a grain ESD of at least 30 nm and up to and including 300 nm.

4. The conductive film element precursor of any of embodiments 1 to 3, wherein the ratio of grain ESD to dry thickness of the first hydrophilic layer is from 0.25:1 to and including 1.75:1.

5. The conductive film element precursor of any of embodiments 1 to 4, wherein the dry thickness of the first hydrophilic overcoat is at least 100 nm and up to and including 800 nm.

6. The conductive film element precursor of any of embodiments 1 to 5, wherein the dry thickness of the first hydrophilic overcoat is at least 300 nm and up to and including 500 nm.

7. The conductive film element precursor of any of embodiments 1 to 6, wherein the silver halide in the first hydrophilic overcoat comprises up to 100 mol % chloride or up to 100 mol % bromide, and up to and including 5 mol % iodide, based on total silver content.

8. The conductive film element precursor of any of embodiments 1 to 7, wherein the silver halide in the first hydrophilic overcoat comprises up to 100 mol % bromide, based on the total silver.

9. The conductive film element precursor of any of embodiments 1 to 8, wherein the exposure sensitivity of the silver halide emulsion in the first hydrophilic overcoat is at least 10% and up to and including 200% of the optimum sensitivity of the silver halide emulsion in the first non-color hydrophilic photosensitive layer, expressed as $\mu J/m^2$.

10. The conductive film element precursor of any of embodiments 1 to 9, further comprising an UV absorbing layer between the first supporting side of the substrate and the first non-color hydrophilic photosensitive layer.

11. The conductive film element precursor of any of embodiments 1 to 10, further comprising on the opposing second supporting side of the substrate, a second non-color hydrophilic photosensitive layer and a second hydrophilic overcoat disposed over the second non-color hydrophilic photosensitive layer.

12. The conductive film element precursor of embodiment 11, wherein the second non-color hydrophilic photosensitive layer and the second hydrophilic overcoat have the same composition as the first non-color hydrophilic photosensitive layer and the first hydrophilic overcoat, respectively.

13. The conductive film element precursor of any of embodiments 1 to 12, wherein the exposure sensitivity of the silver halide emulsion in the first hydrophilic overcoat is at least 10% and up to and including 200% of the optimum sensitivity of the silver halide emulsion in the first non-color hydrophilic photosensitive layer, as expressed as $\mu J/m^2$, and the exposure sensitivity of the silver halide emulsion in the second hydrophilic overcoat is at least 10% and up to and including 200% of the optimum sensitivity of the silver halide emulsion in the second non-color hydrophilic photosensitive layer, expressed as $\mu J/m^2$.

14. A method for providing a conductive film element, comprising:
   - imagewise exposing a conductive film element precursor of any of embodiments 1 to 13, to provide a latent pattern containing silver halide in the first non-color hydrophilic photosensitive layer,
   - converting the silver halide in the latent pattern to silver metal by contacting the exposed conductive film element precursor with a developing solution comprising a silver halide developing agent,
   - removing unconverted silver halide from the first non-color hydrophilic photosensitive layer, leaving silver metal in a pattern corresponding to the latent pattern, and
   - optionally further treating the silver metal in the pattern to enhance its conductivity.

15. The method of embodiment 14, wherein the conductive film element precursor of any of embodiments 1 to 13 further comprises on the opposing second supporting side of the substrate:
   - a second non-color hydrophilic photosensitive layer and a second hydrophilic overcoat disposed over the second non-color hydrophilic photosensitive layer, the second hydrophilic overcoat being the outermost layer on the opposing second supporting side of the substrate,
   - the second non-color hydrophilic photosensitive layer comprising a silver at a coverage of less than 5000 mg Ag/m$^2$, and the second hydrophilic overcoat comprises silver halide in an amount of at least 5 mg Ag/m² and up to and including 150 mg Ag/m², the method further comprising:

imagewise exposing the second non-color hydrophilic photosensitive film to provide a second latent pattern containing silver halide in the second non-color hydrophilic photosensitive layer, converting the silver halide in the second latent pattern to silver metal during contacting the exposed conductive film element precursor with the developing solution comprising the silver halide developing agent, removing unconverted silver halide from the second non-color hydrophilic photosensitive layer, leaving silver metal in a second pattern corresponding to the second latent pattern on the opposing second supporting side of the substrate, and optionally further treating the silver metal in the second pattern to enhance its conductivity.

16. A conductive film element provided by the method of any embodiment 14 or 15.

17. The conductive film element of embodiment 16, wherein the conductive silver pattern on the first supporting side of the substrate and the conductive silver pattern on the opposing second supporting side of the substrate have the same composition.

18. The conductive film element of embodiment 16, wherein the conductive silver pattern on the first supporting side of the substrate and the conductive silver pattern on the opposing second supporting side of the substrate are different in composition, pattern arrangement, or conductive line thickness.

The following Examples are provided to illustrate the practice of this invention and are not meant to be limiting in any manner.

Effectiveness of the electrical contact for the anisotropic conductive overcoat (ACO, hydrophilic overcoat) was assessed using a self capacitance method common in the evaluation of touch screen sensors (TSS) fabricated using indium tin oxide on glass or polyethylene terephthalate. A FT Lab (Korea) Model #TMS2000 was used for this assessment of performance of the contact from an external circuit to the underlying TSS film circuit created below the ACO in the silver halide TSS film.

A silver halide emulsion was prepared as described above having a composition of 98 mol % silver chloride and 2 mol % silver iodide. The emulsion grains had cubic morphology and an edge length 0.36 μm. It was doped with 0.095 mg/Ag mole of iridate(2-), pentachloro(5-methylthioazole.kappa.N3)-, dipotassium and 0.56 mg/Ag mole of cesium pentachloronitrosyl osmate (II). The emulsion was not spectrally sensitized.

Conductive film element precursors were prepared using 100 μm poly(ethylene terephthalate) substrate and coated silver halide emulsion that was hardened using BVSM [1,1'-(methylene(sulfonyl))bis-ethane] coated at 0.5 weight % of total gelatin. A first layer (Layer 1) was provided for UV absorption. The UV absorption at 365 nm increased to 1.7 optical density units. Layer 1 included 1500 mg/m² of gelatin, 300 mg/m² of TINUVIN 328 UV absorbing dye.

A non-color photosensitive silver halide emulsion layer (Layer 2) was provided over Layer 1. The silver (Ag) to gelatin weight ratio was kept constant at 2.33:1 (or at a volume ratio of about 0.233:1). The element further included a hydrophilic overcoat layer (Layer 3) over Layer 2, which Layer 3 included 488 mg/m² of gelatin, 6 mg/m² of 0.6 μm insoluble polymeric matte particles, and conventional coating surfactants.

The exposed silver halide films described above were processed to reduce the silver cations to silver metal and to form conductive film elements using the processing sequence shown in TABLE I. The evaluation results of the conductive film elements are shown below in TABLE VII.

TABLE I

Processing Sequence

| Processing Step/Solution | Processing Temperature (° C.) | Processing Time, (minutes) |
|---|---|---|
| Developing/developer 1 | 40 | 0.5 |
| Washing/rinsing with water | 40 | 1.0 |
| Developing/developer 2 | 40 | 3.0 |
| Fixing/fixing solution | 40 | 1.77 |
| Washing/rinsing with water | 40 | 1.0 |
| Conductivity Enhancement/ Conductivity Enhancement Solution | 60 | 2.0 |
| Washing/rinsing with water | 40 | 1.0 |
| Drying | 60 | 15.0 |
| Conductivity Enhancement/ Conductivity Enhancement Solution | 60 | 2.0 |
| Washing/rinsing with water | 40 | 1.0 |
| Drying | 60 | 15.0 |
| Conductivity Enhancement/ Conductivity Enhancement Solution | 60 | 2.0 |
| Washing/rinsing with water | 40 | 1.0 |
| Drying | 60 | 15.0 |
| Stabilizing/Stabilizer Solution | 40 | 1.0 |
| Washing/rinsing with water | 40 | 1.0 |

The aqueous processing solutions used in the noted processing steps are described below in TABLES II through VI, all of which were prepared in de-mineralized water. Drying was carried out using a convection oven.

TABLE II

Developer 1

| Component | Amount (g/liter) |
|---|---|
| Potassium Hydroxide (45.5 wt. %) | 10.83 |
| Sodium Bromide | 5.00 |
| 4,4-Dimethyl-1-phenyl-3-pyrazolidinone | 0.33 |
| 1-Phenyl-5-mercaptotetrazole | 0.13 |
| 5-methylbenzotriazole* | 0.17 |
| Sodium hydroxide (50 wt. %) | 1.82 |
| Phosphonic acid, [nitrilotris(methylene)]tris-, pentasodium salt | 0.29 |
| N,N'-1,2-ethanediylbis(N-(carboxymethyl)glycine, | 1.77 |
| Sodium carbonate monohydrate | 8.33 |
| Potassium Sulfite (45 wt. %) | 83.33 |
| Hydroquinone | 12.50 |
| 5,5'-[Dithiobis(4,1-phenyleneimino)]bis(5-oxo-pentanoic acid | 0.12 |

TABLE III

Developer 2

| Component | Amount (g/liter) |
|---|---|
| Sodium Sulfite | 92.54 |
| Hydroquinone | 4.63 |
| N,N-bis(2-(bis(carboxymethyl)-amino)ethyl)- glycine, pentasodium salt | 0.950 |

TABLE III-continued

Developer 2

| Component | Amount (g/liter) |
|---|---|
| Sodium tetraborate pentahydrate | 2.830 |
| Sodium thiocyanate | 0.42 |

TABLE IV

Fixing Solution

| Component | Amount (g/liter) |
|---|---|
| Acetic Acid | 24.43 |
| Sodium hydroxide (50 wt. %) | 10.25 |
| Ammonium thiosulfite | 246.50 |
| Sodium metabisulfite | 15.88 |
| Sodium tetraborate pentahydrate | 11.18 |
| Aluminum sulfate (18.5 wt. %) | 36.26 |

TABLE V

Conductivity Enhancement Solution

| Component | Amount (g/liter) |
|---|---|
| [1,2-Bis(3-aminopropylamino)- ethane] | 11.15 |
| Triethanolamine (99 wt. %) | 38.6 |
| Triethanolamine hydrochloride | 14.0 |
| Dimethylaminoborane | 12.0 |
| Sodium lauryl sulfate | 0.030 |
| 2,2-Bipyridine | 1.00 |

TABLE VI

Stabilizer Solution

| Component | Amount (g/liter) |
|---|---|
| Sodium hydroxide (50 wt. %) | 0.29 |
| N-[3-(2,5-dihydro-5-thioxo-1H-tetrazol-1-yl)phenyl]acetamide | 0.82 |

Comparative Example 1

A conductive film element was prepared with a standard photographic gelatin overcoat whose overall thickness was 0.45 µm. No silver halide was added to the overcoat.

Invention Example 1

In this conductive film element precursor, the TSS film hydrophilic overcoat (Layer 3) contained an ACO silver halide emulsion having a grain ESD of 0.45 µm. The sensitivity of the silver halide emulsion was adjusted via speed-controlling dopants and chemical sensitization to be within a factor of 0.2-2.0 of the TSS film photosensitive silver halide emulsion in Layer 2 as expressed in µJ/m$^2$. The ACO silver halide emulsion was coated at $1\times10^{11}$ silver halide grains/m$^2$.

Invention Example 2

Another conductive film element precursor was used as in Invention Example 1 except that the ACO silver halide emulsion in Layer 3 was coated at $3\times10^{11}$ silver halide grains/m$^2$.

Invention Example 3

A conductive film element precursor was prepared like that in Invention Example 1 except that the gelatin hydrophilic overcoat thickness (Layer 3) was increased to 0.6 µm. The ACO silver halide emulsion in Layer 3 was coated at $1\times10^{11}$ silver halide grains/m$^2$.

Invention Example 4

A conductive film element precursor was prepared like that in Like Invention Example 3 except the ACO silver halide emulsion was coated at $3\times10^{11}$ silver halide grains/m$^2$.

TABLE VII

| Example | Detection of TSS film open circuits | Detection of TSS film shorted circuits |
|---|---|---|
| Comparative Example 1 | Very poor | Very poor |
| Invention Example 1 | Good | Good |
| Invention Example 2 | Very good | Very good |
| Invention Example 3 | Fair | Fair |
| Invention Example 4 | Moderate | Moderate |

The invention has been described in detail with particular reference to certain preferred embodiments thereof, but it will be understood that variations and modifications can be effected within the spirit and scope of the invention.

The invention claimed is:

1. A conductive film element precursor comprising a substrate having a first supporting side and an opposing second supporting side, and the conductive film element precursor comprising, in order on the first supporting side the substrate:
    a first non-color hydrophilic photosensitive layer comprising a silver halide at a coverage of less than 5000 mg Ag/m$^2$, and
    a first hydrophilic overcoat disposed over the first non-color hydrophilic photosensitive layer, which first hydrophilic overcoat is the outermost layer on the first supporting side of the substrate, and the first hydrophilic overcoat comprises silver halide in an amount of at least 5 mg Ag/m$^2$ and up to and including 150 mg Ag/m$^2$.

2. The conductive film element precursor of claim 1, wherein the silver halide in the first hydrophilic overcoat has a grain ESD of at least 100 nm and up to and including 1000 nm.

3. The conductive film element precursor of claim 1, wherein the silver halide in the first non-color hydrophilic photosensitive layer has a grain ESD of at least 30 nm and up to and including 300 nm.

4. The conductive film element precursor of claim 1, wherein the ratio of grain ESD to dry thickness of the first hydrophilic layer is from 0.25:1 to and including 1.75:1.

5. The conductive film element precursor of claim 1, wherein the dry thickness of the first hydrophilic overcoat is at least 100 nm and up to and including 800 nm.

6. The conductive film element precursor of claim 1, wherein the dry thickness of the first hydrophilic overcoat is at least 300 nm and up to and including 500 nm.

7. The conductive film element precursor of claim 1, wherein the silver halide in the first hydrophilic overcoat comprises up to 100 mol % chloride or up to 100 mol % bromide, and up to and including 5 mol % iodide, based on total silver content.

8. The conductive film element precursor of claim 1, wherein the silver halide in the first hydrophilic overcoat comprises up to 100 mol % bromide, based on the total silver.

9. The conductive film element precursor of claim 1, wherein the exposure sensitivity of the silver halide emulsion in the first hydrophilic overcoat is at least 10% and up to and including 200% of the optimum sensitivity of the silver halide emulsion in the first non-color hydrophilic photosensitive layer, expressed as $\mu J/m^2$.

10. The conductive film element precursor of claim 1, further comprising an UV absorbing layer between the first supporting side of the substrate and the first non-color hydrophilic photosensitive layer.

11. The conductive film element precursor of claim 1, further comprising on the opposing second supporting side of the substrate, a second non-color hydrophilic photosensitive layer and a second hydrophilic overcoat disposed over the second non-color hydrophilic photosensitive layer.

12. The conductive film element precursor of claim 11, wherein the second non-color hydrophilic photosensitive layer and the second hydrophilic overcoat have the same composition as the first non-color hydrophilic photosensitive layer and the first hydrophilic overcoat, respectively.

13. The conductive film element precursor of claim 1, wherein the exposure sensitivity of the silver halide emulsion in the first hydrophilic overcoat is at least 10% and up to and including 200% of the optimum sensitivity of the silver halide emulsion in the first non-color hydrophilic photosensitive layer, as expressed as $\mu J/m^2$, and the exposure sensitivity of the silver halide emulsion in the second hydrophilic overcoat is at least 10% and up to and including 200% of the optimum sensitivity of the silver halide emulsion in the second non-color hydrophilic photosensitive layer, as expressed as $\mu J/m^2$.

14. A method for providing a conductive film element, comprising:

imagewise exposing a conductive film element precursor comprising:

a substrate having a first supporting side and an opposing second supporting side, and the conductive film element precursor comprising, in order on the first supporting side of the substrate:

a first non-color hydrophilic photosensitive layer comprising a silver halide at a coverage of less than 5000 mg $Ag/m^2$, and a first hydrophilic overcoat disposed over the first non-color hydrophilic photosensitive layer, which first hydrophilic overcoat is the outermost layer on the first supporting side of the substrate, and the first hydrophilic overcoat comprises silver in an amount of at least 5 mg $Ag/m^2$ and up to and including 150 mg $Ag/m^2$, to provide a latent pattern containing silver halide in the first non-color hydrophilic photosensitive layer, converting the silver halide in the latent pattern to silver metal by contacting the exposed conductive film element precursor with a developing solution comprising a silver halide developing agent, removing unconverted silver halide from the first non-color hydrophilic photosensitive layer, leaving silver metal in a pattern corresponding to the latent pattern, and optionally further treating the silver metal in the pattern to enhance its conductivity.

15. The method of claim 14, wherein the conductive film element precursor further comprises on the opposing second supporting side of the substrate:

a second non-color hydrophilic photosensitive layer and a second hydrophilic overcoat disposed over the second non-color hydrophilic photosensitive layer, the second hydrophilic overcoat being the outermost layer on the opposing second supporting side of the substrate, the second non-color hydrophilic photosensitive layer comprising a silver at a coverage of less than 5000 mg $Ag/m^2$, and the second hydrophilic overcoat comprises silver halide in an amount of at least 5 mg $Ag/m^2$ and up to and including 150 mg $Ag/m^2$, the method further comprising:

imagewise exposing the second non-color hydrophilic photosensitive film to provide a second latent pattern containing silver halide in the second non-color hydrophilic photosensitive layer, converting the silver halide in the second latent pattern to silver metal during contacting the exposed conductive film element precursor with the developing solution comprising the silver halide developing agent, removing unconverted silver halide from the second non-color hydrophilic photosensitive layer, leaving silver metal in a second pattern corresponding to the second latent pattern on the opposing second supporting side of the substrate, and optionally further treating the silver metal in the second pattern to enhance its conductivity.

16. A conductive film element provided by the method of claim 14, wherein the conductive film element comprises:

a substrate having a first supporting side and an opposing second supporting side, and comprising on the first supporting side:

a first non-color hydrophilic layer comprising a conductive silver pattern, and a first hydrophilic overcoat disposed over the first non-color hydrophilic layer, which first hydrophilic overcoat is the outermost layer on the first supporting side of the substrate, and the first hydrophilic overcoat comprises silver halide in an amount of at least 5 mg $Ag/m^2$ and up to and including 150 mg $Ag/m^2$.

17. The conductive film element of claim 16, further comprising on the opposing second supporting side:

a second non-color hydrophilic layer comprising a conductive silver pattern, and a second hydrophilic overcoat disposed over the second non-color hydrophilic layer, which second hydrophilic overcoat is an outermost layer on the opposing second supporting side of the substrate, and the second hydrophilic overcoat comprises silver halide in an amount of at least 5 mg $Ag/m^2$ and up to and including 150 mg $Ag/m^2$.

18. The conductive film element of claim 17, wherein the conductive silver pattern on the first supporting side of the substrate and the conductive silver pattern on the opposing second supporting side of the substrate have the same composition.

19. The conductive film element of claim 17, wherein the conductive silver pattern on the first supporting side of the substrate and the conductive silver pattern on the opposing second supporting side of the substrate are different in composition, pattern arrangement, or conductive line thickness.

* * * * *